United States Patent
Liang et al.

(10) Patent No.: US 10,274,534 B2
(45) Date of Patent: Apr. 30, 2019

(54) CHIP AND READING CIRCUIT FOR DIE ID IN CHIP

(71) Applicant: HUAWEI TECHNOLOGIES CO., LTD., Shenzhen, Guangdong (CN)

(72) Inventors: Bo Liang, Shenzhen (CN); Qi Wang, Shanghai (CN); Yuan Liu, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 19 days.

(21) Appl. No.: 15/493,369

(22) Filed: Apr. 21, 2017

(65) Prior Publication Data

US 2017/0307680 A1    Oct. 26, 2017

(30) Foreign Application Priority Data

Apr. 23, 2016  (CN) .......................... 2016 1 0255945

(51) Int. Cl.
| | |
|---|---|
| *G01R 31/02* | (2006.01) |
| *G01R 31/28* | (2006.01) |
| *H01L 23/525* | (2006.01) |
| *H01L 23/58* | (2006.01) |

(52) U.S. Cl.
CPC ...... *G01R 31/2851* (2013.01); *H01L 23/5256* (2013.01); *H01L 23/58* (2013.01)

(58) Field of Classification Search
CPC . G01R 31/2851; H01L 23/58; H01L 23/5256; G11C 29/88; G11C 29/883
See application file for complete search history.

(56) References Cited

U.S. PATENT DOCUMENTS 8,050,129 B2 * 11/2011  Liu .................... G04B 37/0481
                                                                365/225.7

* cited by examiner

*Primary Examiner* — Minh N Tang
(74) *Attorney, Agent, or Firm* — Staas & Halsey LLP (57) ABSTRACT

A reading circuit for a die ID in a chip is provided. The reading circuit includes a chip damage detection circuit, a switch selector, a fuse controller, and a fuse device, where the fuse device stores the die ID; the fuse controller reads the die ID from the fuse device; the chip damage detection circuit detects whether a processor in the chip is capable of operating properly, so as to obtain a detection result, and notify the switch selector of the detection result; and when the detection result is that the processor is capable of operating properly, the switch selector connects the processor and the fuse controller; and when the detection result is that the processor is not capable of operating properly, the switch selector connects the fuse controller and a maintenance device that is located outside the chip.

17 Claims, 3 Drawing Sheets

CHIP AND READING CIRCUIT FOR DIE ID IN CHIP

CROSS-REFERENCE TO RELATED APPLICATIONS

This application claims priority to Chinese Patent Application No. 201610255945.7, filed on Apr. 23, 2016, which is hereby incorporated by reference in its entirety.

TECHNICAL FIELD

The present application relates to the circuit field, and in particular, to a chip and a reading circuit for a die ID in a chip.

BACKGROUND

A die (die) ID (identity) is a unique identification number of each chip. According to the die ID, information about the chip can be obtained, such as a manufacturer, a production date, a production line, and X/Y (horizontal/vertical) coordinates in a wafer. Die IDs in chips produced by different chip manufacturers include different information, mainly reflected in the following: Data of die IDs in chips produced by different chip manufacturers have different lengths, and each data bit in the data is defined differently. The die ID is stored in an electrically programmable fuse (eFuse) device of the chip. The device is referred to as a fuse device and is non-volatile. Therefore, when the chip fails, multiple types of information about the chip, such as information about a manufacturer of the chip, a production date, a production line, and X/Y coordinates in a wafer, can be obtained by reading the die ID from the fuse device of the chip, so as to provide an effective clue for analyzing a failure cause of the chip.

In the prior art, a method for reading a die ID is as follows: With the assistance of processors, such as a CPU (central processing unit), an MCU (micro control unit), a DSP (digital signal processor), or a logic circuit used for implementing control or a computation, a die ID is read from a fuse device to a logic register, and then the die ID in the logic register is printed or displayed on a screen, and presented to testing personnel. The logic circuit includes multiple logic gates or transistors. However, in this manner, if the processor such as the CPU, the MCU, the DSP, or the logic circuit is not capable of operating properly, the die ID cannot be read even if information about the die ID in the fuse device is complete.

SUMMARY

Embodiments of the present invention provide a chip, and a circuit that can normally read a die ID from a fuse device even when a processor is not capable of operating properly.

According to a first aspect, the present invention provides a reading circuit for a die ID in a chip, where the reading circuit includes a chip damage detection circuit, a switch selector, a fuse controller, and a fuse device. The chip damage detection circuit is configured to detect whether a processor in the chip is capable of operating properly, so as to obtain a detection result, and notify the switch selector of the detection result. The switch selector is configured to: when the detection result is that the processor is capable of operating properly, connect the processor and the fuse controller. After the connection, the processor controls the fuse controller to read the die ID stored in the fuse device. In addition, the switch selector is further configured to: when the detection result is that the processor is not capable of operating properly, connect the fuse controller and a maintenance device that is located outside the chip. After the connection, the maintenance device controls the fuse controller to read the die ID stored in the fuse device.

In the reading circuit for a die ID in a chip provided in the present invention, a chip damage detection circuit and a switch selector are additionally disposed. If the chip damage detection circuit detects that the processor is not capable of operating properly, the switch selector connects the fuse controller and the maintenance device that is located outside the chip, so as to select the maintenance device to control the fuse controller to read the die ID from the fuse device.

With reference to the first aspect, in a first implementation manner of the first aspect of the embodiments of the present invention, the chip damage detection circuit is configured to: when at least one of the abnormality of the power supply detected by using the first input end and the abnormality of the processor detected by using the second input end occurs, determine that the detection result is that the processor is not capable of operating properly; or when neither the abnormality of the power supply is successfully detected by using the first input end nor the abnormality of the processor is successfully detected by using the second input end, determine that the detection result is that the processor is capable of operating properly. The chip damage detection circuit sends the detection result to the switch selector by using an output end.

Because the chip damage detection circuit is capable of separately detecting an abnormality of the power supply and an abnormality of the chip, when the abnormality occurs on the power supply or when the abnormality occurs on the chip, the situation that the processor is not capable of operating properly can be detected.

With reference to the first possible implementation manner of the first aspect of the embodiments of the present invention, in a second possible implementation manner of the first aspect of the embodiments of the present invention, the chip damage detection circuit includes a power detector and an "OR" unit. The power detector is configured to receive a power signal by using the first input end, and when successfully detecting the abnormality of the power supply according to the power signal, generate a power supply abnormality signal; and the "OR" unit is configured to: when the power supply abnormality signal is received from the power detector or a processor abnormality signal is received by using the second input end, determine that the detection result is that the processor is not capable of operating properly; or when neither the power supply abnormality signal is received from the power detector nor the processor abnormality signal is received by using the second input end, determine that the detection result is that the processor is capable of operating properly.

With reference to the second possible implementation manner of the first aspect of the embodiments of the present invention, in a third possible implementation manner of the first aspect of the embodiments of the present invention, the power detector includes a comparator. The comparator is configured to compare the power signal with a reference voltage, and when the power signal is less than the reference voltage, determine that the power supply is abnormal and generate the power supply abnormality signal.

With reference to the third possible implementation manner of the first aspect of the embodiments of the present invention, in a fourth possible implementation manner of the first aspect of the embodiments of the present invention, the power detector further includes: a switch circuit, a pull-down transistor, and a short circuit control unit. The short circuit control unit is configured to: when receiving the power supply abnormality signal outputted by the comparator, send a pull-down signal to the pull-down transistor. The pull-down transistor pulls down the power signal to a low voltage when receiving the pull-down signal, where the low voltage is less than the reference voltage. In addition, the short circuit control unit is further configured to send the disconnection signal to the switch circuit. The switch circuit is configured to disconnect the power supply from the comparator when receiving the disconnection signal.

When the short circuit control unit receives the power supply abnormality signal outputted by the comparator, the short circuit control unit controls the switch circuit to be opened, so that the power supply is disconnected from the comparator, so as to prevent a short circuit power supply from causing damage to the comparator. In addition, the short circuit control unit controls the pull-down transistor to pull down the power signal to a low voltage less than the reference voltage, so that the comparator keeps outputting a power supply abnormality signal, so as to avoid the following case: When a power fluctuates, the comparator sometimes outputs the power supply abnormality signal, and sometimes does not output the power supply abnormality signal, and consequently, the switch circuit sometimes breaks connection between the power supply and the comparator, and sometimes restores connection between the power supply and the comparator, causing damage to the chip.

With reference to the third or the fourth possible implementation manner of the first aspect of the embodiments of the present invention, in a fifth possible implementation manner of the first aspect of the embodiments of the present invention, the power detector further includes a voltage divider device, where the voltage divider device is configured to receive an output voltage of the power supply, and divide the output voltage of the power supply to obtain the power signal.

The voltage divider device divides the voltage of the power supply and then outputs, to the comparator for comparison, the power signal obtained by performing voltage division. Therefore, impact from the power supply to the comparator can be effectively reduced, and a probability that the comparator is damaged is reduced.

With reference to the fifth possible implementation manner of the first aspect of the embodiments of the present invention, in a sixth possible implementation manner of the first aspect of the embodiments of the present invention, the voltage divider device includes series resistors.

With reference to any one of the first aspect or the first to the sixth possible implementation manners of the first aspect of the embodiments of the present invention, in a seventh possible implementation manner of the first aspect of the embodiments of the present invention, the reading circuit is further configured to receive, from the maintenance device, at least one of an external power, an external clock, or an address of the fuse device in the chip, where the external power is configured to supply power to the reading circuit, the external clock provides the reading circuit with a clock required for operating, and the address is used for instructing the fuse controller to read the die ID from the fuse device according to the address.

According to a second aspect, the present invention provides a chip. The chip includes a processor and the reading circuit for a die ID according to any one in the first aspect, where the processor is configured to implement signal processing.

With reference to the second aspect, in a first possible implementation manner of the second aspect, the processor includes: a central processing unit CPU, a digital signal processor DSP, a micro controller MCU, or a logic circuit configured to execute control or a computation.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

In the following, the present invention is described with reference to the accompanying drawings and embodiments.

Figure 1:
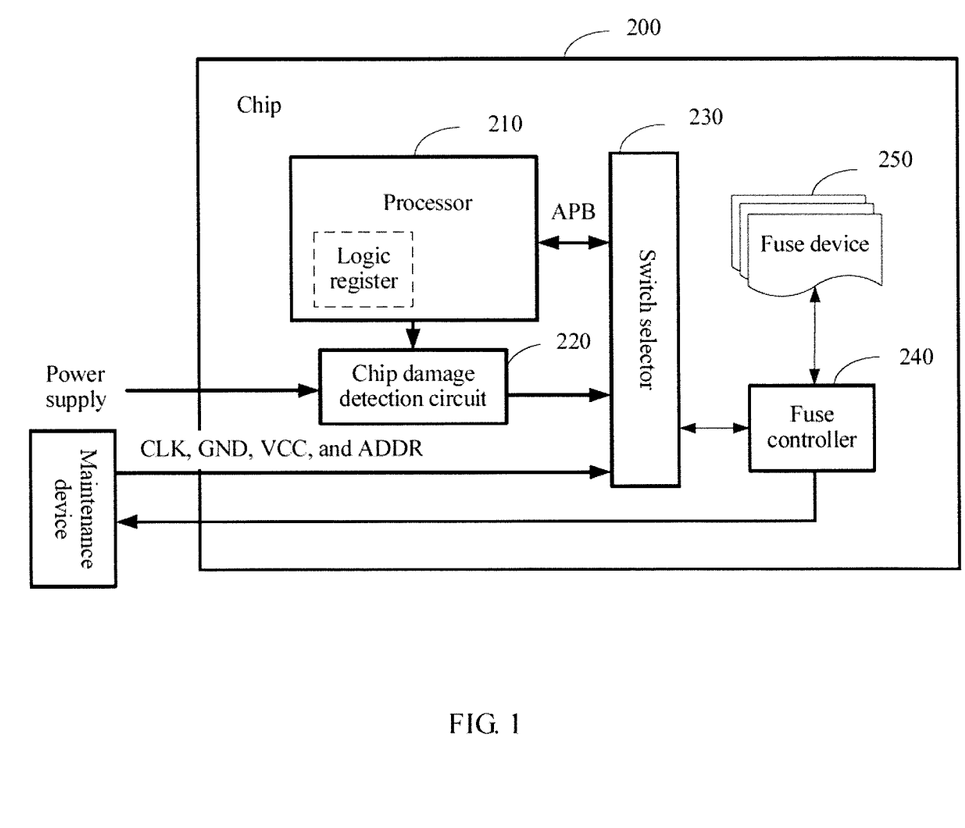
FIG. 1 is a circuit diagram of a reading circuit for a die ID in a chip according to an embodiment of the present invention.

Referring to FIG. 1, FIG. 1 is a reading circuit for a die ID in a chip according to the present invention. The reading circuit for a die ID in a chip that is shown in FIG. 1 may be applied to a chip 200. Specifically, the reading circuit for a die ID in a chip may include: a processor 210, a chip damage detection circuit 220, a switch selector 230, a fuse controller 240, and a fuse device 250. The processor 210 may include a CPU, a DSP, an MCU, a logic circuit configured to execute control or a computation, or the like. The processor 210 is configured to implement signal processing, for example, process any one of the following: a communications protocol algorithm, application software, an operating system (OS), a digital signal, a speech signal, a video signal, or a sensor signal.

A first input end of the chip damage detection circuit 220 is configured to connect to an external power supply of the chip 200. The power supply may be a power supply that supplies power directly to the chip, or may be a power supply that supplies power to the processor 210. The power supply may be a digital power supply or an analog power supply, and this is not limited in this embodiment. A second input end of the chip damage detection circuit 220 may be connected to an output end of the processor 210 by using an Advanced Peripheral Bus (APB). Alternatively, the second input end may be connected to an output end of the processor 210 by using a bus of another form. An output end of the chip damage detection circuit 220 is connected to a selector end of the switch selector 230, a read and write end of the processor 210 is connected to a first input end of the switch selector 230, and a second input end of the switch selector 230 is configured to connect to an output end of a maintenance device that is outside the chip 200. An output end of the switch selector 230 is configured to connect to an input end of the fuse controller 240, a read and write end of the fuse controller 240 is connected to the fuse device 250, and an output end of the fuse controller 240 is configured to connect to an input end of the maintenance device that is outside the chip 200.

The fuse device 250 is configured to store a die ID. The processor 210 is a calculation or control center of the entire chip 200, and is responsible for calculation or control processing. The fuse controller 240 is capable of reading, under control of the processor 210, the die ID from the fuse device 250. The chip damage detection circuit 220 is configured to detect whether the processor 210 in the chip 200 is capable of operating properly, so as to obtain a detection result, and notify the switch selector 230 of the detection result. The switch selector 230 is configured to: when the detection result is that the processor 210 is capable of operating properly, connect the processor 210 and the fuse controller 240, so as to select the processor 210 to control the fuse controller 240 to read the die ID from the fuse device 250; or when the detection result is that the processor 210 is not capable of operating properly, connect the fuse controller 240 and the maintenance device that is located outside the chip 200, so as to select the maintenance device to control the fuse controller 240 to read the die ID from the fuse device 250.

The fuse device 250 includes a fuse array that is arranged by row or by column. The fuse array includes multiple fuses. Each fuse is used to indicate one data bit. When a fuse in the fuse array is conducted, a value indicating the data bit is "1". When a fuse in the fuse array is cut off, a value indicating the data bit is "0". It is assumed that the processor 210 is in a normal operating state before the chip 200 is delivered from a factory. Therefore, a result of detecting the processor 210 by the chip damage detection circuit 220 is that the processor 210 is capable of operating properly. The chip damage detection circuit 220 inputs, to the selector end of the switch selector 230 by using the output end, the detection result that the processor 210 is capable of operating properly, so that the first input end of the switch selector 230 is opened and the second input end of the switch selector 230 is closed. The processor 210 controls, by using the second input end of the switch selector 230, the fuse controller 240 to input a current to the fuse device 250, so as to burn out a fuse corresponding to a data bit with a value "0", thereby writing the die ID to the fuse device 250. Therefore, the die ID of the chip 200 is always stored in the fuse device 250, provided that the fuse device 250 is not damaged.

When a die ID needs to be read from the fuse device 250, because manners of reading a die ID are totally different when the processor 210 is capable of operating properly and when the processor 210 is not capable of operating properly, before a die ID is read, it is necessary to first determine whether the processor 210 is capable of operating properly. There are generally the following two cases in which the processor 210 is not capable of operating properly: (1) The power supply has a short circuit or the like. In this case, the power supply is not capable of properly supplying power to the processor 210, and therefore, the processor 210 is not capable of operating properly. (2). Abnormal start-up, bus suspension, or the like occurs on the processor 210. In this embodiment of the present invention, if the foregoing two cases occur, it is considered that the processor 210 is not capable of operating properly. If neither of the foregoing two cases occurs, it is considered that the processor 210 is capable of operating properly.

If the power supply of the processor 210 or the entire chip 200 has a short circuit or the like, an abnormality occurs in an output voltage from the power supply to the first input end of the chip damage detection circuit 220. If abnormal start-up, bus suspension, or the like occurs on the processor 210, the processor 210 outputs a processor abnormality signal to the second input end of the chip damage detection circuit 220. Therefore, when the die ID needs to be read from the fuse device 250, if the chip damage detection circuit 220 successfully detects at least one of the abnormality of the power supply by using the first input end or the abnormality of the processor 210 by using the second input end, the chip damage detection circuit 220 determines that the detection result is that the processor 210 is not capable of operating properly. (2) If the chip damage detection circuit 220 neither successfully detects the abnormality of the power supply by using the first input end nor successfully detects the abnormality of the processor 210 by using the second input end, the chip damage detection circuit 220 determines that the detection result is that the processor 210 is capable of operating properly. Then, the chip damage detection circuit 220 notifies the switch selector 230 of the detection result. When the detection result is that the processor 210 is capable of operating properly, the switch selector 230 connects the processor 210 and the fuse controller 240, so as to select the processor 210 to control the fuse controller 240 to read the die ID from the fuse device 250; or when the detection result is that the processor 210 is not capable of operating properly, the switch selector 230 connects the fuse controller 240 and the maintenance device that is located outside the chip 200, so as to select the maintenance device to control the fuse controller 240 to read the die ID from the fuse device 250. The maintenance device may be a design for X (DFX) unit or the like. DFX is short for design for all phases of a product life cycle. X may represent a product life cycle or a phase of the product life cycle, for example, assembly, manufacturing, test, machining, use, maintenance, recycling, or scrapping, or may represent product competitiveness or a factor that determines product competitiveness, for example, quality, costs, or time. In this embodiment of the present invention, the DFX unit is an artificially designed unit. The DFX unit can simulate the following behavior: The processor 210 controls the fuse controller 240 to detect a burnout condition of all fuses in the fuse device 250, so as to read the die ID. Optionally, the function may be implemented by a test/ maintenance/management device that has a similar function, other than the DFX unit.

When the processor 210 is configured to control the fuse controller 240 to read the die ID from the fuse device 250, the processor 210 uses the second input end of the switch selector 230 to control the fuse controller 240 to read the die ID from the fuse device 250. After the fuse controller 240 reads the die ID, the fuse controller 240 maps the read die ID to a logic register in the processor 210 by using the second input end of the switch selector 230. Then, the die ID in the logic register is printed or displayed on a screen, and presented to testing personnel.

When the maintenance device is configured to control the fuse controller 240 to read the die ID from the fuse device 250, the maintenance device uses the switch selector 230 to input, to the fuse controller 240, at least one of the following information: an external clock (CLK), a "ground" (GND), an external power (VCC), or an address (ADDR). Then, with the help of the input information, the fuse controller 240 reads the die ID from the fuse device 250. After the fuse controller 240 reads the die ID, the fuse controller 240 sends the read die ID to the maintenance device by using the output end. The maintenance device prints the die ID or displays the die ID on a screen, and presents the die ID to testing personnel. The external power is configured to supply power to the reading circuit, the external clock provides the reading circuit with a clock required for operating, and the address is used for instructing the fuse controller to read the die ID from the fuse device according to the address.

Figure 2:
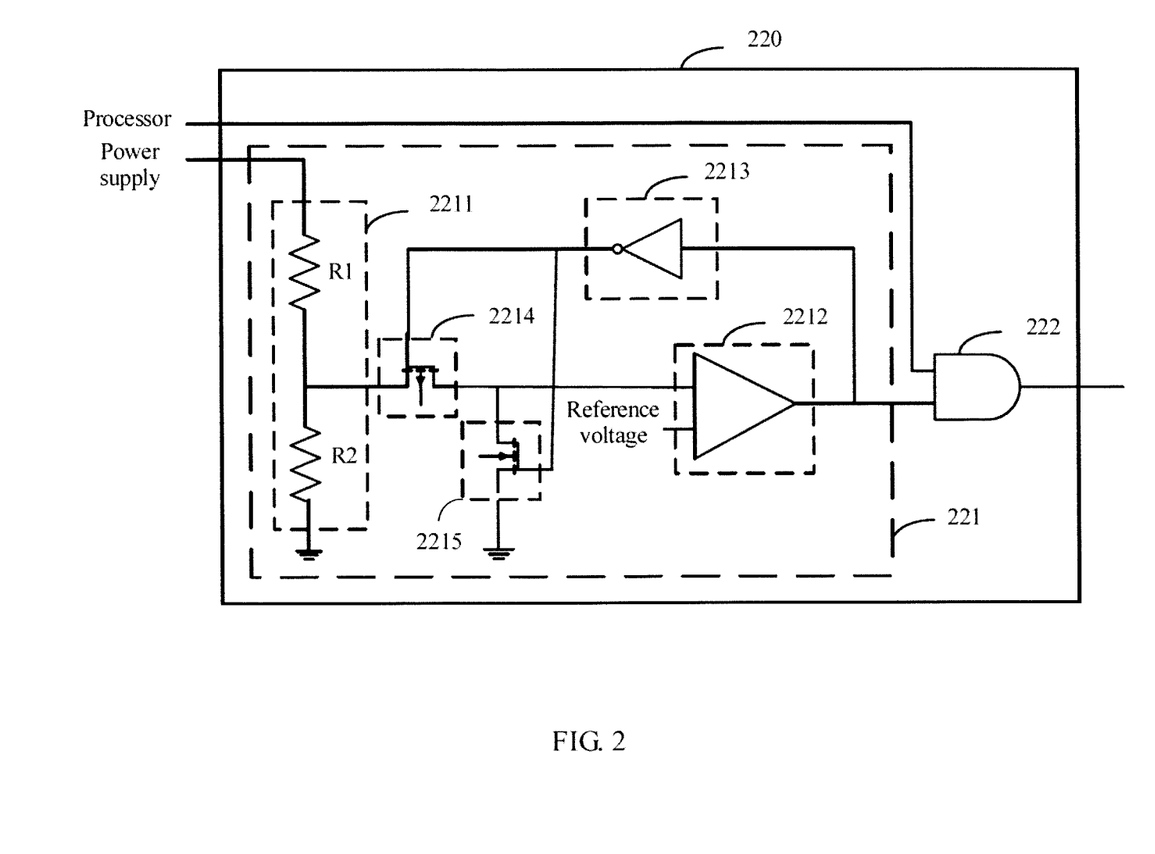
FIG. 2 is a circuit diagram of a chip damage detection circuit in a reading circuit for a die ID in a chip according to an embodiment of the present invention.

In a specific embodiment, referring to FIG. 2, the chip damage detection circuit 220 includes a power detector 221 and an "OR" unit 222. An input end of the power detector 221 is configured to connect to the first input end of the chip damage detection circuit 220. An output end of the power detector 221 is connected to a first input end of the "OR" unit 222. A second input end of the "OR" unit 222 is configured to connect to the second input end of the chip damage detection circuit 220. The power detector 221 receives a power signal by using the input end, and when successfully detecting the abnormality of the power supply according to the power signal, generates a power supply abnormality signal, and sends the power supply abnormality signal to the "OR" unit 222 by using the output end. When the power supply abnormality signal is received from the power detector 221 by using the first input end, or the processor abnormality signal is received by using the second input end, the "OR" unit 222 determines that the detection result is that the processor 210 is not capable of operating properly. In addition, when neither the power supply abnormality signal is received from the power detector 221 nor the processor abnormality signal is received, the "OR" unit 222 determines that the detection result is that the processor 210 is capable of operating properly. The "OR" unit 222 outputs the detection result to the switch selector 230 by using the output end.

More specifically, the power detector 221 includes a voltage divider device 2211, a comparator 2212, a short circuit control unit 2213, a switch circuit 2214, and a pull-down transistor 2215. An input end of the voltage divider device 2211 is configured to connect to the power supply, and an output end of the voltage divider device 2211 is connected to an input end of the switch circuit 2214. An output end of the switch circuit 2214 is connected to a first input end of the comparator 2212, and a second input end of the comparator 2212 is configured to input a reference signal. An output end of the comparator 2212 is connected to the second input end of the "OR" unit 222, and the output end of the comparator 2212 is connected to an input end of the short circuit control unit 2213. An output end of the short circuit control unit 2213 is connected to a control end of the switch circuit 2214, and the output end of the short circuit control unit 2213 is further connected to a control end of the pull-down transistor 2215. An input end of the pull-down transistor 2215 is connected to the output end of the switch circuit 2214, and an output end of the pull-down transistor 2215 is grounded.

The power supply outputs a voltage to the voltage divider device 2211. The voltage divider device 2211 divides the output voltage of the power supply to obtain a power signal, and outputs the power signal to the comparator 2212 by using the switch circuit 2214. The comparator 2212 compares the power signal with a reference voltage. If the power signal is greater than or equal to the reference voltage, the comparator 2212 determines that no abnormality occurs on the power supply, and does not send the power supply abnormality signal to the short circuit control unit 2213. If the power signal is less than the reference voltage, the comparator 2212 determines that the abnormality occurs on the power supply, generates the power supply abnormality signal, and sends the power supply abnormality signal to the short circuit control unit 2213. When no power supply abnormality signal outputted by the comparator 2212 is received, the short circuit control unit 2213 controls the switch circuit 2214 to keep connection between the power supply and the comparator 2212, and the pull-down transistor 2215 is cut off, so that a power signal can be transmitted to the comparator 2212 by using the switch circuit 2214, but is not led to the "ground" by the pull-down transistor 2215. When receiving the power supply abnormality signal outputted by the comparator 2212, the short circuit control unit 2213 sends a disconnection signal to the switch circuit 2214 to disconnect the power supply from the comparator 2212, so that the short circuit power supply is prevented from causing damage to the comparator 2212. In addition, the short circuit control unit 2213 controls the pull-down transistor 2215 to pull down the power signal to a low voltage less than the reference voltage, so that the comparator 2212 keeps outputting the power supply abnormality signal, so as to avoid the following case: When a power fluctuates, the comparator 2212 sometimes outputs the power supply abnormality signal, and sometimes does not output the power supply abnormality signal, and consequently, the switch circuit 2214 sometimes breaks connection between the power supply and the comparator 2212, and sometimes restores connection between the power supply and the comparator 2212, causing damage to the chip 200. It can be learned that a main body of the power detector 221 is the comparator 2212. The voltage divider device 2211, the short circuit control unit 2213, the switch circuit 2214, and the pull-down transistor 2215 are not mandatory circuits of the power detector 221, but are merely configured to achieve further beneficial effects, and may be omitted. It can be understood that a pull-down signal and a disconnection signal are a same signal in this embodiment of the present invention.

In a more specific embodiment, the voltage divider device 2211 may include multiple series resistors that are configured to implement voltage division. In FIG. 2, two resistors are used as an example for description, but are not configured to limit this embodiment. The resistor may be replaced by a transistor, an MOS (metal-oxide-semiconductor) transistor, or another device. The voltage divider device 2211 in FIG. 2 includes a first resistor $R_1$ and a second resistor $R_2$ that are connected in series. A first end of the first resistor $R_1$ is configured to connect to the power supply, a second end of the first resistor $R_1$ is connected to a first end of the second resistor $R_2$, and a second end of the second resistor $R_2$ is grounded. An output voltage of the power supply is divided as a joint result of the first resistor $R_1$ and the second resistor $R_2$, so as to obtain a power signal, and the power signal is outputted to the comparator 2212 by using a connection point of the first resistor $R_1$ and the second resistor $R_2$. It can be learned according to a voltage division formula: $V_D=R_2/R_1+R_2 V_{CC}$. $V_D$ is the power signal, $R_1$ is a resistance of the first resistor, $R_2$ is a resistance of the second resistor, and $V_{CC}$ is the output voltage of the power supply.

In a more specific embodiment, the short circuit control unit 2213 includes a phase inverter. The short circuit control unit 2213 is configured to invert a phase of a signal outputted by the comparator 2212, and separately input an inverted signal to the switch circuit 2214 and the pull-down transistor 2215. When the comparator 2212 outputs a power supply abnormality signal, the phase inverter inverts a phase of the power supply abnormality signal, so as to obtain a disconnection signal and a pull-down signal, and outputs the disconnection signal and the pull-down signal to the switch circuit 2214 and the pull-down transistor 2215 respectively. It can be understood that the short circuit control unit 2213 may selectively include an odd quantity of phase inverters.

In a more specific embodiment, the switch circuit 2214 includes an input end, a control end, and an output end. When a disconnection signal is inputted into the control end of the switch circuit 2214, the input end is disconnected from the output end, so that a power signal cannot pass through the switch circuit 2214. When no disconnection signal is inputted into the switch circuit 2214, the input end is kept connected to the output end, so that a power signal can pass through the switch circuit 2214. Generally, the switch circuit 2214 may be implemented by an NMOS (N-type metal-oxide-semiconductor) or a PMOS (P-type metal-oxide-semiconductor) transistor. In this embodiment, the PMOS transistor is used as an example for description. When a transistor of the switch circuit 2214 is a PMOS transistor, a type of the pull-down transistor 2215 is opposite to a type of the transistor of the switch circuit 2214, that is, is an NMOS transistor. Although both the pull-down transistor 2215 and the transistor of the switch circuit 2214 can receive an output signal from the short circuit control unit 2213, only one of them can be conducted.

In a more specific embodiment, the pull-down transistor 2215 includes an input end, a control end, and an output end. When a pull-down signal is inputted into the control end of the pull-down transistor 2215, the pull-down transistor 2215 is conducted, so that the pull-down transistor 2215 is connected to the "ground". When no pull-down signal is inputted into the control end of the pull-down transistor 2215, the pull-down transistor 2215 is cut off, so that the pull-down transistor 2215 is disconnected from the "ground". The pull-down transistor 2215 may be implemented by an N-type metal-oxide-semiconductor (NMOS) transistor or a P-type metal-oxide-semiconductor (PMOS) transistor. In this embodiment, the NMOS transistor is used as an example for description. When the pull-down transistor 2215 is a PMOS transistor, an entire circuit structure needs to be slightly adjusted. For example, the short circuit control unit 2213 may selectively include an even quantity of phase inverters, and the switch circuit 2214 is an NMOS transistor.

Figure 3:
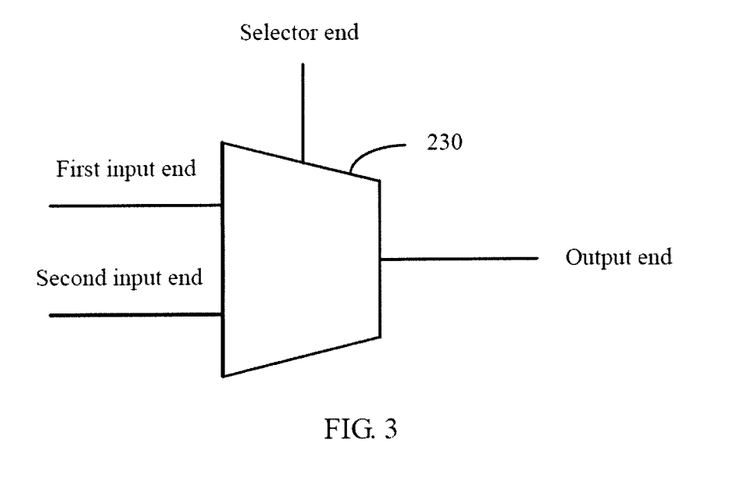
FIG. 3 is a circuit diagram of a switch selector in a reading circuit for a die ID according to an embodiment of the present invention.

In a more specific embodiment, the switch selector 230 shown in FIG. 3 includes a first input end, a second input end, a selector end, and an output end. The first input end is configured to connect to the processor 210 by using an APB, the second input end is configured to connect to the maintenance device that is outside the chip, the selector end is configured to connect to the chip damage detection circuit 220, and the output end is configured to connect to the fuse controller 240. When a detection result that the processor 210 is capable of operating properly is inputted into the selector end of the switch selector 230, the first input end of the switch selector 230 is connected to the output end of the switch selector 230. When a detection result that the processor 210 is not capable of operating properly is inputted into the selector end of the switch selector 230, the second input end of the switch selector 230 is connected to the output end of the switch selector 230. For example, when the detection result that the processor 210 is capable of operating properly is indicated by "0", the detection result that the processor 210 is not capable of operating properly is indicated by "1"; when the detection result that the processor 210 is capable of operating properly is indicated by "1", the detection result that the processor 210 is not capable of operating properly is indicated by "0".

The embodiments of the present invention further provide a chip. The chip integrates a die ID reading circuit. Technical details of the die ID reading circuit are shown in FIG. 1, FIG. 2, FIG. 3, and related descriptions, and are not described herein again.

It should be noted that the connection mentioned in the embodiments of the present invention should be understood as general coupling or electrical connection. The connection not only includes direct connection using a conducting wire, but also includes indirect connection using another device.

What is disclosed above is merely example embodiments of the present invention, and certainly is not intended to limit the protection scope of the present invention. A person of ordinary skill in the art may understand that all or some of processes that implement the foregoing embodiments and equivalent modifications made in accordance with the claims of the present invention shall fall within the scope of the present invention.

The invention claimed is:

1. A reading circuit for a die identity (ID) in a chip, the reading circuit comprising:
   a switch selector
   a fuse device configured to store the die ID;
   a fuse controller configured to read the die ID from the fuse device; and
   a chip damage detection circuit configured to detect whether a processor in the chip is capable of operating properly, so as to obtain a detection result, and notify the switch selector of the detection result; wherein
   the switch selector is configured to:
      when the detection result is that the processor is capable of operating properly, connect the processor and the fuse controller, so as to select the processor to control the fuse controller to read the die ID from the fuse device; and
      when the detection result is that the processor is not capable of operating properly, connect the fuse controller and a maintenance device that is located outside the chip, so as to select the maintenance device to control the fuse controller to read the die ID from the fuse device.

2. The circuit according to claim 1, wherein the chip damage detection circuit comprises a first input end, a second input end, and an output end, wherein the first input end is connected to a power supply of the chip or the processor and is configured to detect an abnormality of the power supply, the second input end is connected to an output end of the processor and is configured to detect an abnormality of the processor, and the output end is connected to the switch selector and is configured to provide the detection result for the switch selector; and
   the chip damage detection circuit is configured to:
      when at least one of the abnormality of the power supply detected by using the first input end and the abnormality of the processor detected by using the second input end occurs, determine that the detection result is that the processor is not capable of operating properly; and
      when neither the abnormality of the power supply is successfully detected by using the first input end nor the abnormality of the processor is successfully detected by using the second input end, determine that the detection result is that the processor is capable of operating properly.

3. The circuit according to claim 2, wherein the chip damage detection circuit comprises a power detector and an "OR" unit, wherein
   the power detector is connected to the first input end and is configured to receive a power signal by using the first input end, and when successfully detecting the abnormality of the power supply according to the power signal, generate a power supply abnormality signal; and the "OR" unit is connected to the second input end and is configured to:
when the power supply abnormality signal is received from the power detector or a processor abnormality signal is received by using the second input end, determine that the detection result is that the processor is not capable of operating properly; and
when neither the power supply abnormality signal is received from the power detector nor the processor abnormality signal is received by using the second input end, determine that the detection result is that the processor is capable of operating properly.

4. The circuit according to claim 3, wherein the power detector comprises a comparator, wherein
the comparator is connected to the first input end and is configured to compare the power signal with a reference voltage, and when the power signal is less than the reference voltage, determine that the power supply is abnormal and generate the power supply abnormality signal.

5. The circuit according to claim 4, wherein the power detector further comprises: a switch circuit, a pull-down transistor, and a short circuit control unit, wherein
the pull-down transistor is configured to pull down the power signal to a low voltage when receiving a pull-down signal;
the switch circuit is configured to disconnect the power supply from the comparator when receiving a disconnection signal; and
the short circuit control unit is configured to: when receiving the power supply abnormality signal outputted by the comparator, send the pull-down signal to the pull-down transistor to pull down the power signal to the low voltage, and send the disconnection signal to the switch circuit to disconnect the power supply from the comparator, wherein the low voltage is less than the reference voltage.

6. The circuit according to claim 4, wherein the power detector further comprises a voltage divider device, wherein the voltage divider device is configured to receive an output voltage of the power supply, and divide the output voltage of the power supply to obtain the power signal.

7. The circuit according to claim 6, wherein the voltage divider device comprises series resistors.

8. The circuit according to claim 1, wherein the reading circuit is further configured to receive, from the maintenance device, at least one of an external power, an external clock, or an address of the fuse device in the chip, wherein the external power is configured to supply power to the reading circuit, the external clock provides the reading circuit with a clock required for operating, and the address is used for instructing the fuse controller to read the die ID from the fuse device according to the address.

9. A chip comprising:
a processor to implement signal processing; and
a reading circuit for a die identity (ID), the reading circuit comprising:
a switch selector;
a fuse device configured to store the die ID;
a fuse controller configured to read the die ID from the fuse device; and
a chip damage detection circuit configured to detect whether the processor in the chip is capable of operating properly, so as to obtain a detection result, and notify the switch selector of the detection result; and based upon the detection result, the switch selector is configured to
select the processor to control the fuse controller to read the die ID from the fuse device
or select a maintenance device to control the fuse controller to read the die ID from the fuse device.

10. The chip according to claim 9, wherein the processor comprises: a central processing unit CPU, a digital signal processor DSP, a micro controller MCU, or a logic circuit configured to execute control or a computation.

11. The chip according to claim 9, wherein the chip damage detection circuit comprises a first input end, a second input end, and an output end, wherein the first input end is connected to a power supply of the chip or the processor and is configured to detect an abnormality of the power supply, the second input end is connected to an output end of the processor and is configured to detect an abnormality of the processor, and the output end is connected to the switch selector and is configured to provide the detection result for the switch selector; and
the chip damage detection circuit is configured to:
when at least one of the abnormality of the power supply detected by using the first input end and the abnormality of the processor detected by using the second input end occurs, determine that the detection result is that the processor is not capable of operating properly; and
when neither the abnormality of the power supply is successfully detected by using the first input end nor the abnormality of the processor is successfully detected by using the second input end, determine that the detection result is that the processor is capable of operating properly.

12. The chip according to claim 11, wherein the chip damage detection circuit comprises a power detector and an "OR" unit, wherein
the power detector is connected to the first input end and is configured to receive a power signal by using the first input end, and when successfully detecting the abnormality of the power supply according to the power signal, generate a power supply abnormality signal; and
the "OR" unit is connected to the second input end and is configured to:
when the power supply abnormality signal is received from the power detector or a processor abnormality signal is received by using the second input end, determine that the detection result is that the processor is not capable of operating properly; and
when neither the power supply abnormality signal is received from the power detector nor the processor abnormality signal is received by using the second input end, determine that the detection result is that the processor is capable of operating properly.

13. The chip according to claim 12, wherein the power detector comprises a comparator, wherein
the comparator is connected to the first input end and is configured to compare the power signal with a reference voltage, and when the power signal is less than the reference voltage, determine that the power supply is abnormal and generate the power supply abnormality signal.

14. The chip according to claim 13, wherein the power detector further comprises: a switch circuit, a pull-down transistor, and a short circuit control unit, wherein
the pull-down transistor is configured to pull down the power signal to a low voltage when receiving a pull-down signal;

the switch circuit is configured to disconnect the power supply from the comparator when receiving a disconnection signal; and the short circuit control unit is configured to: when receiving the power supply abnormality signal outputted by the comparator, send the pull-down signal to the pull-down transistor to pull down the power signal to the low voltage, and send the disconnection signal to the switch circuit to disconnect the power supply from the comparator, wherein the low voltage is less than the reference voltage.

15. The chip according to claim 13, wherein the power detector further comprises a voltage divider device, wherein the voltage divider device is configured to receive an output voltage of the power supply, and divide the output voltage of the power supply to obtain the power signal.

16. The chip according to claim 15, wherein the voltage divider device comprises series resistors.

17. The chip according to claim 9, wherein the reading circuit is further configured to receive, from the maintenance device, at least one of an external power, an external clock, or an address of the fuse device in the chip, wherein the external power is configured to supply power to the reading circuit, the external clock provides the reading circuit with a clock required for operating, and the address is used for instructing the fuse controller to read the die ID from the fuse device according to the address.

* * * * *